United States Patent [19]

Moyer

[11] Patent Number: 4,467,451

[45] Date of Patent: Aug. 21, 1984

[54] NONVOLATILE RANDOM ACCESS MEMORY CELL

[75] Inventor: Norman E. Moyer, Balboa, Calif.

[73] Assignee: Hughes Aircraft Company, El Segundo, Calif.

[21] Appl. No.: 328,324

[22] Filed: Dec. 7, 1981

[51] Int. Cl.³ .............................................. G11C 11/40
[52] U.S. Cl. ..................................... 365/156; 365/185
[58] Field of Search ............... 365/154, 156, 185, 228, 365/190

[56] References Cited

U.S. PATENT DOCUMENTS

| | | | |
|---|---|---|---|
| 3,660,827 | 5/1972 | Tickle | 365/228 |
| 3,985,963 | 10/1976 | Boutmy et al. | 179/15 BD |
| 4,128,773 | 12/1978 | Troutman et al. | 365/156 |
| 4,132,904 | 1/1979 | Harari | 365/156 |
| 4,342,101 | 7/1982 | Edwards | 365/154 |
| 4,348,745 | 9/1982 | Schmitz | 365/154 |

FOREIGN PATENT DOCUMENTS 3028075 2/1982 Fed. Rep. of Germany .

Primary Examiner—Stuart N. Hecker
Attorney, Agent, or Firm—John Holtrichter, Jr.; A. W. Karambelas

[57] ABSTRACT

In the NOVRAM cell of the present invention, a pair of cross-coupled variable threshold floating gate MOS (VTMOS) transistors facilitates nonvolatile and non-inverting writing and reading of data in the memory cell. The disadvantages of the prior art are overcome by completely disconnecting the VTVMOS transistors from the remainder of the memory cell during normal volatile writing and reading operations. Accordingly, during normal writing and reading operations the NOVRAM cell of the present invention performs just as if the pair of cross-coupled VTVMOS transistors were not even present, so that there is no problem of leakage currents or instability due to excessive charging or discharging of the floating gates of the VTVMOS transistors.

13 Claims, 3 Drawing Figures

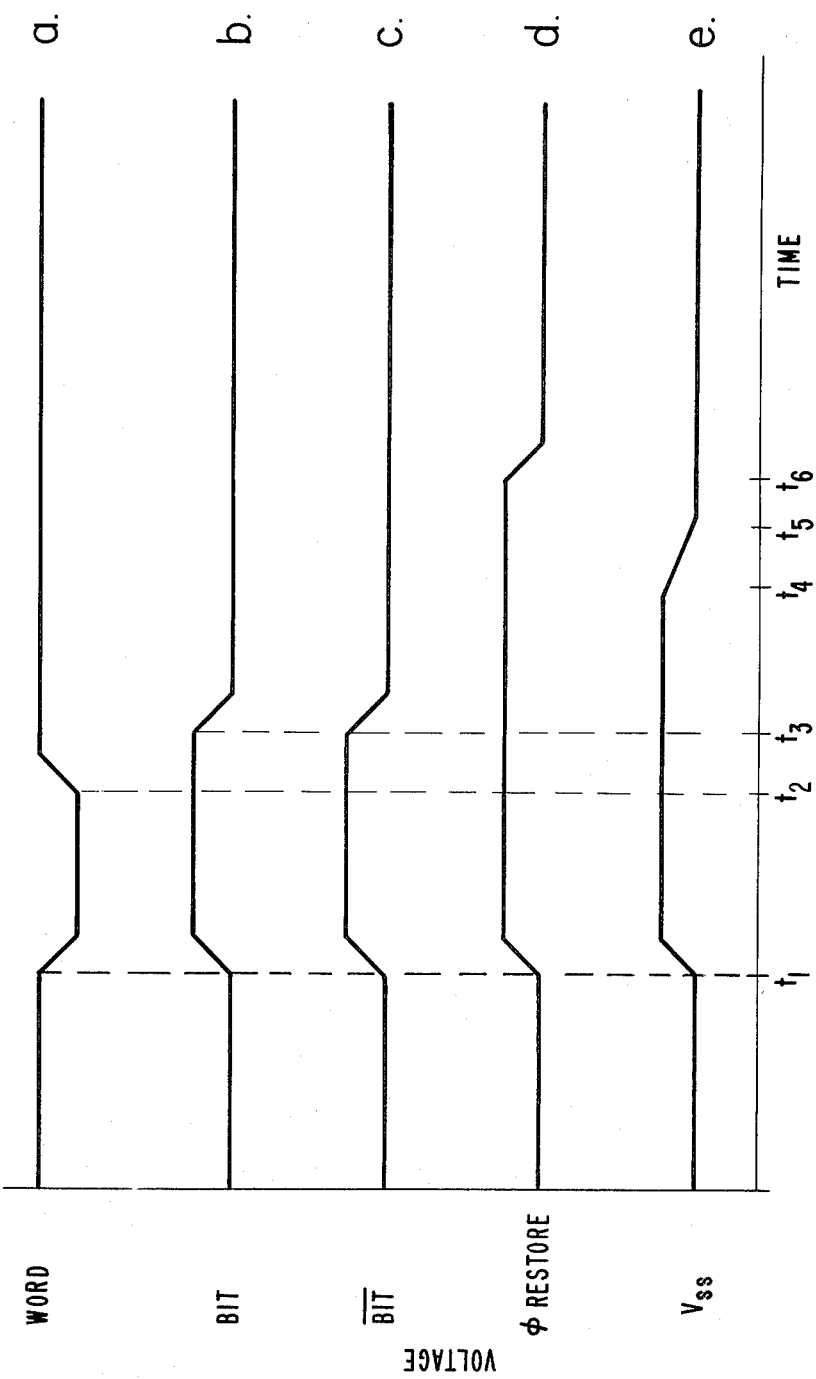

NONVOLATILE RANDOM ACCESS MEMORY CELL

TECHNICAL FIELD

The invention comprises a single cell of a nonvolatile random access memory including two cross-coupled floating gate tunneling field effect transistors which are isolated from the remainder of the cell during normal operation.

BACKGROUND ART

A nonvolatile random access memory cell is disclosed in U.S. patent application Ser. No. 200,758 now U.S. Pat. No. 4,348,745 entitled "Nonvolatile Random Access Memory Having Non-Inverted Storage" filed Oct. 27, 1980 by Lawrence S. Schmitz and assigned to the assignee of the present application, the disclosure of the Schmitz application being incorporated herein in its entirety by reference. The Schmitz application describes a nonvolatile random access memory (NOVRAM) including a metal oxide semiconductor transistor having a floating gate.

The charge stored on the floating gate determines the threshold voltage of the transistor, and may be changed by causing charge to tunnel through a thin spot in the insulation underlying the floating gate. Creation of a sufficient electrical potential across the thin spot is accomplished by capacitively coupling the floating gate to another electrode connected to a voltage source. This type of transistor is referred to in this specification as a variable threshold voltage metal oxide semiconductor (VTVMOS) transistor. It is analogous to the usual type of MOS field effect transistor except that the gate stores charge in a virtually permanent manner. The signal controlling the tunneling of charge to the floating gate may be independent of the signal represented by the source to drain current flow through the VTVMOS transistor.

The invention of the Schmitz application was an improvement over the prior art embodied in U.S. Pat. No. 4,126,773 filed Nov. 7, 1977 by Bruce Lee Troutman and Lawrence S. Schmitz, the improvement being that writing and reading of nonvolatile data did not cause logic inversion. The disclosure of the Troutman and Schmitz patent is also incorporated herein by reference.

One problem in such prior art NOVRAM cells is that the presence of the VTVMOS transistors may undesirably upset the operation of the NOVRAM cell. Specifically, in an n-channel device, if one of the VTVMOS transistors is turned "on" very hard (that is to say, its floating gate is so depleted of electrons that it acquires a positive charge), that FATMOS transistor cannot be turned off by applying voltages in the usual control range (0 volts to 5 volts). Therefore, a leakage current continually flows through that VTVMOS transistor, causing power to be absorbed, a significant disadvantage. On the other hand, if one of the VTVMOS transistors is turned "off" very hard (that is to say, its floating gate is charged with an excessive number of electrons) the NOVRAM cell is rendered unstable and can change state during a read operation.

The pair of VTVMOS transistors in the NOVRAM cell of the Schmitz application permits nonvolatile writing and reading of data in the memory cell. However, during normal operation of the memory cell, in which data is written and read in a volatile manner, the nonvolatile state of the two VTVMOS transistors must be ignored by the cell. The disadvantage of the prior art NOVRAM cells exemplified by the above-referenced Troutman patent and Schmitz application is that the VTVMOS transistors create an inherent imbalance in the memory cell which affects its operation during normal (or volatile) reading and writing, giving rise to the problems of leakage current and instability mentioned previously. One solution to this problem in the prior art was to connect a pair of bypass transistors in parallel with the pair of VTVMOS transistors in the NOVRAM cell. However, this prior art solution did not completely isolate the NOVRAM cell from the presence of the VTVMOS transistors during normal volatile reading and writing operations.

SUMMARY OF THE INVENTION

In the NOVRAM cell of the present invention, a pair of cross-coupled VTVMOS transistors facilitates nonvolatile and noninverting writing and reading of data in the memory cell. However, the disadvantages of the prior art are overcome by completely disconnecting the VTVMOS transistors from the remainder of the memory cell during normal volatile writing and reading operations. Accordingly, during normal writing and reading operations the NOVRAM cell of the present invention performs just as if the pair of cross-coupled VTVMOS transistors were not even present, so that there is no problem of leakage currents or instability due to excessive charging or discharging of the floating gates of the VTVMOS transistors. Accordingly, the invention represents a substantial improvement over prior art NOVRAM cells described previously.

The present invention includes a NOVRAM cell comprising two cross-coupled branches, each branch including a p-channel and an n-channel field effect transistor (FET) complementary pair. A pair of VTVMOS transistors having cross-coupled floating gates are connected in parallel with the two NOVRAM cell branches, each VTVMOS transistor being connected in parallel with a corresponding one of the two branches. The invention further includes an isolation transistor pair connected between the VTVMOS transistor pair and the two NOVRAM cell branches. The isolation transistor pair effectively disconnects the VTVMOS transistor pair from the two NOVRAM cell branches during normal volatile writing and reading operations. However, following the loss of power or upon command, the isolation transistor pair perform a restore operation in which the two branches of the NOVRAM cell are temporarily connected to the VTVMOS transistor pair so that the NOVRAM cell becomes latched into a logic state corresponding to the state of the VTVMOS transistor pair stored previously during a nonvolatile writing step. Thus, the invention permits normal (or volatile) reading and writing operations to be carried on in a NOVRAM cell without interference from effects due to the presence of the VTVMOS transistor pair.

Another advantage of the invention is that the threshold voltages of all of the transistors in the cell may be the same, requiring only one processing step to establish all transistor threshold voltages. In the prior art, the inherent imbalance between the memory cell branches caused by the presence of the VTVMOS transistor pair was avoid by connecting a bypass FET transistor pair in parallel with each of the two branches, the bypass transistor pair having a threshold voltage different (usually higher) than the threshold voltages of the other transistors in the cell. This required two different threshold voltage setting steps. (In some processes, the threshold voltage of the bypass transistor pair was established during a first ion implantation step while the threshold voltage of the remaining transistors was established during a second ion implantation step). In the present invention, only one threshold voltage setting step is required because the threshold voltages of all the transistors in the NOVRAM cell of the present invention may be the same.

DESCRIPTION OF THE FIGURES

The invention is best understood by reference to the accompanying drawings, of which:

FIG. 3 includes timing diagrams illustrating the restore operation in the NOVRAM cell FIG. 2, of which:

FIG. 3a illustrates the time domain voltage waveform of the word line of FIG. 2;

FIG. 3b illustrates the time domain voltage waveform of the bit line of FIG. 2;

FIG. 3c illustrates the time domain voltage waveform of the bit line of FIG. 2;

FIG. 3d illustrates the time domain waveform of the command signal $\phi$ restore; and FIG. 3e illustrates the time domain waveform of the supply voltage $V_{SS}$ during the restore operation.

DETAILED DESCRIPTION

Prior Art

Figure 1:
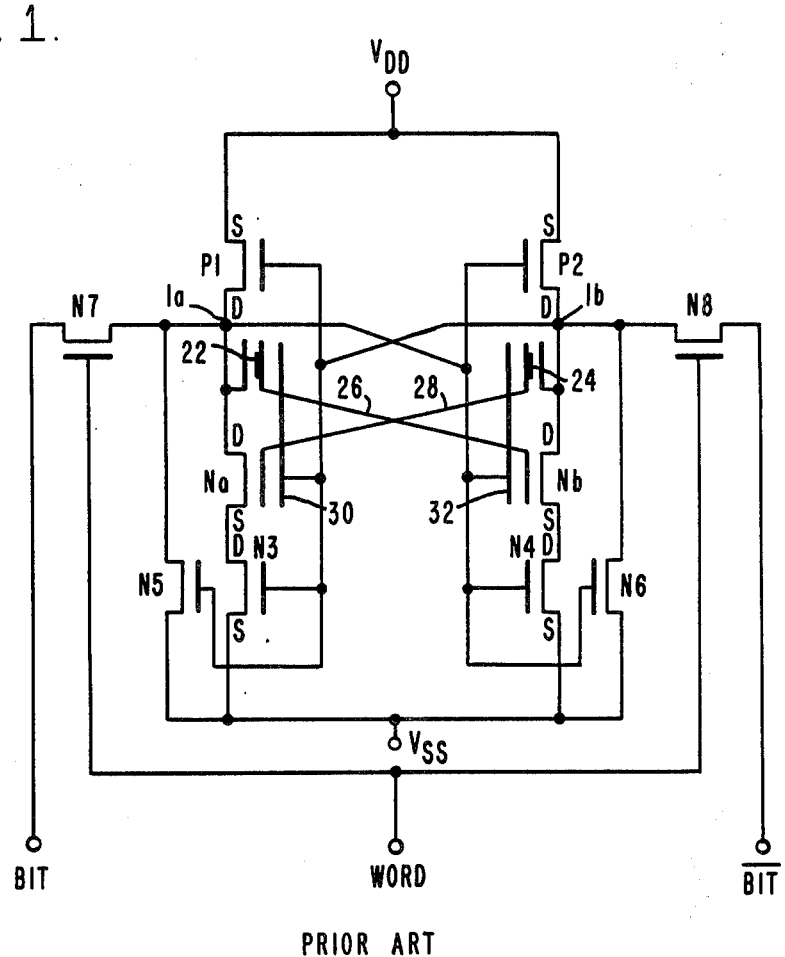
FIG. 1 is a simplified schematic diagram of a prior art NOVRAM cell.

FIG. 1 illustrates a NOVRAM cell described in the above-referenced Schmitz patent application, the Schmitz application fully describing the structure and operation of the NOVRAM cell of FIG. 1. As described in the Schmitz application, the NOVRAM cell comprises two branches, the first branch including the transistors P1, Na, N3 and a bypass transistor N5 connected in parallel with that branch, the second branch including the transistors P2, Nb, N4 and a bypass transistor N6 connected in parallel with the second branch, and addressing transistors N7 and N8. Tunneling regions 22 and 24 associated with cross-coupled floating gates 26 and 28 respectively are capacitively coupled to overlying electrodes 30 and 32. As described in the Schmitz application, it is the cross-coupling of the floating gates 26, 28 between the FATMOS transistor pair Na, Nb which renders the NOVRAM cell of FIG. 1 noninverting during nonvolatile writing and reading operations. The bypass transistors N5 and N6 have a somewhat higher threshold voltage. They are connected in parallel with the two NOVRAM cell branches in order to minimize imbalance between the two branches caused by the presence of the VTVMOS transistor pair Na, Nb during normal volatile reading and writing operations. This latter feature is described in the above-referenced Troutman and Schmitz patent (U.S. Pat. No. 4,126,773).

However, despite the presence of the bypass transistors N5, N6, the fact remains that the VTVMOS transistors Na, Nb are connected in series with the corresponding branch of the NOVRAM cell FIG. 1, so that some imbalance always exists during normal volatile reading and writing operations. This is especially true if the VTVMOS transistor pair Na, Nb have been programmed in nonvolatile fashion in the manner described in the Schmitz application, in which case one of the floating gates 26, 28 has a net negative charge while the other has a net positive charge.

Isolation of the VTVMOS Transistor Pair

Figure 2:
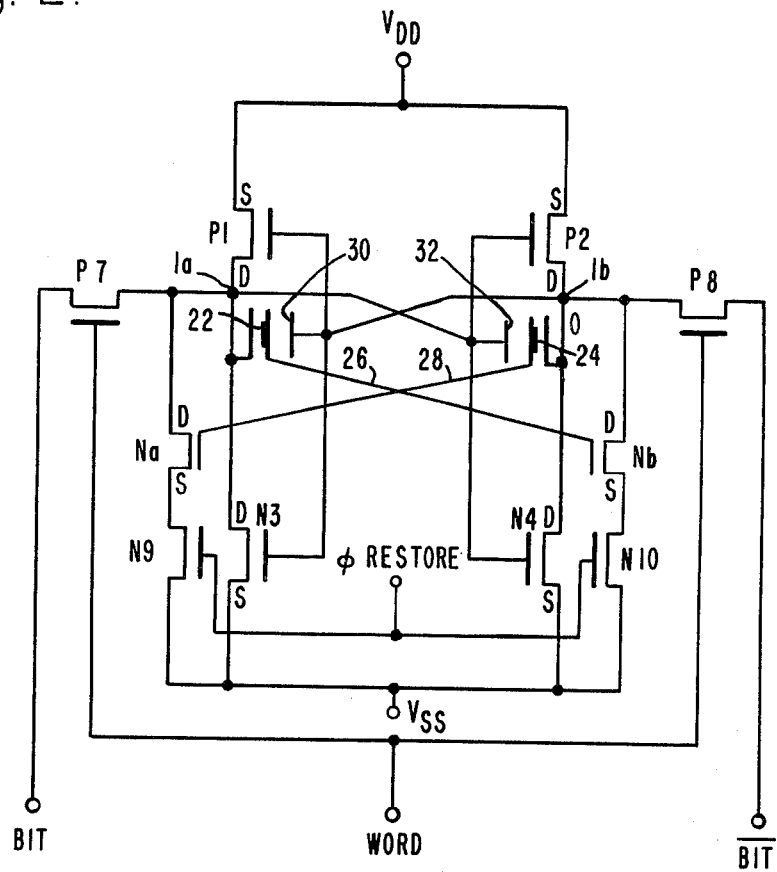
FIG. 2 is a simplified schematic diagram of the NOVRAM cell of the present invention.

In the present invention, the foregoing problems are overcome by isolating the VTVMOS transistor pair Na, Nb from the two branches of the NOVRAM cell. As illustrated in FIG. 2, rather than being connected in series in each branch, the VTVMOS transistor pair Na, Nb are connected in parallel with the two branches, and are isolated from the two branches by an isolation transistor pair N9, N10. The gates of the isolation transistors N9, N10 are connected to receive a command signal $\phi$ restore. This operates to program the NOVRAM cell of FIG. 2 whenever it is desired to set the state of the cell in accordance with data stored in nonvolatile fashion in the VTVMOS transistor pair Na, Nb. One advantage of the invention illustrated in FIG. 2 is that during normal or volatile reading and writing operations, the command signal $\phi$ restore maintains the isolation transistors N9, N10 off so that the VTVMOS transistor pair Na, Nb is effectively removed from the NOVRAM cell of FIG. 2. Accordingly, the remainder of the cell, namely the transistors P1, P2, N3, N4, P7, P8, operates as a normal six-transistor cell just as if the VTVMOS transistor pair Na, Nb were not even present. Accordingly, there is no imbalance between the two branches of the cell during normal volatile reading and writing operations.

Another advantage of the invention is that the necessity for the parallel transistor N5, N6 is eliminated because there is no need to compensate for the presence of the VTVMOS transistor pair Na, Nb during volatile reading and writing operation, the VTVMOS transistor pair being isolated in the present invention. As a result, there is no necessity for any of the transistors in the NOVRAM cell of FIG. 2 to have different threshold voltages, a significant advantage.

During normal (or volatile) reading and writing operations in a NOVRAM cell of FIG. 2, the bit and $\overline{bit}$ lines and the word line are operated in the same manner as described in the above-referenced Schmitz patent application, and this description will not be repeated here. If it is desired to store data permanently, the bit line, $\overline{bit}$ line, word line, $V_{DD}$ terminal and $V_{SS}$ terminal are all controlled in the manner of the nonvolatile writing steps also described in the above-referenced Schmitz application. During all the foregoing operations, the command signal $\phi$ restore maintains the isolation transistors N9, N10 in the off state so that the logic state stored on the floating gates 26, 28 does not affect the operation of a NOVRAM cell of FIG. 2.

Restore Operation

When it is desired to set the logic state of the NOVRAM cell of FIG. 2 in accordance with the state permanently stored on the floating gates 26, 28, a restore operation is performed. In the restore operation, the command signal $\phi$ restore turns the isolation transistors N9, N10 "on" so that the FATMOS transistors Na, Nb are connected to their respective branches of the NOVRAM cell of FIG. 2, thus causing the cross-coupled transistors P1, P2, N3, N4 to latch into the logic state defined by the difference in the charge stored on the floating electrodes 26,28.

The restore operation will now be described by simultaneous reference to FIGS. 2 and 3. At time $t_1$, a voltage is applied to the WORD line which turns on the addressing transistors, P7, P8. It should be noted that the addressing transistors N7, N8 of the prior art NOVRAM cell of FIG. 1 were described in the Schmitz application as being n-channel while the same addressing transistors in the present invention are p-channel transistors P7, P8. The voltage on the word line is illustrated in FIG. 3 as decreasing to zero at time $t_1$. Simultaneously, the voltages on the bit and $\overline{\text{bit}}$ lines, illustrated in FIGS. 3b and c respectively, are increased to a positive voltage on the order of +5 volts. Also at time $t_1$, the power supply $V_{SS}$ is raised from the usual value of 0 volts to +5 volts so that it is equal to the voltage supply $V_{DD}$. This disables the NOVRAM cell. Furthermore, at time $t_1$, the command signal $\phi$ restore pulses positively so that the VTVMOS transistor pair Na, Nb is connected to the two branches of the NOVRAM cell of FIG. 2. At this time, a positive voltage is supplied to the nodes 1a, 1b of the NOVRAM cell of FIG. 2, which discharges any extra charge present at the nodes 1a, 1b so that the nodes are effectively cleared for the next operation.

At time $t_2$ the word line is turned off so that the addressing transistors P7, P8 are turned off. At time $t_3$ the positive voltages applied to the bit and $\overline{\text{bit}}$ lines may be removed as illustrated in FIGS. 3b and 3c. Then, at time $t_4$, the voltage supply $V_{SS}$ is returned slowly to its usual level of 0 volts (substrate ground) as illustrated in FIG. 3e. At time $t_5$ the voltage supply $V_{SS}$ has reached 0 volts magnitude so that the NOVRAM cell is no longer disabled.

At this time, the command signal $\phi$ restore is still on, so that the VTVMOS transistors Na, Nb are connected to the two branches of the cell of FIG. 2, creating an imbalance between the two branches. Accordingly, one branch becomes fully turned off while the other branch becomes fully turned on. For example, if the nonvolatile writing step caused a negative charge to be stored on the floating gate 26 and a positive charge to be stored on a floating gate 28, the VTVMOS transistor Na would be turned on, thus decreasing the voltage on the node 1a and consequently decreasing the voltage on the gate of the transistor N4 in the opposite branch. This causes the voltage on the second node 1b to increase so as to turn on the gate of the transistor N3. As a result, the transistor N3 will be turned on while the transistor N4 will be turned off.

At time $t_6$ the command signal $\phi$ restore is turned off so that the VTVMOS transistor pair Na, Nb is effectively isolated from the remainder of the NOVRAM cell, and the cell may continue to operate in the normal volatile reading and writing mode described in the Schmitz application.

In another embodiment, the load transistors P1, P2 may be of the same conductivity type as the VTV transistors Na, Nb. Alternatively, the load transistors P1, P2 may be replaced by, for example, polycrystalline silicon resistors.

In summary, the NOVRAM cell of the present invention realizes all of the advantages of the non-inverting NOVRAM cell of the Schmitz application, while eliminating the disadvantage of imbalance during volatile read and write operations caused by the presence of the nonvolatile VTVMOS transistor pair.

What is claimed is:

1. A nonvolatile random access memory (NOVRAM) formed on a semiconductive medium, comprising:
    two sets of series connected devices, each set comprising a load, a latch transistor of one conductivity-type having a control electrode, and a node connected to said latch transistor and to said load, each set being connected between two voltage supply lines, said node being connected to the control electrode of the latch transistor of the opposite set; and
    two groups of series connected elements connected between a power line and a respective one of said nodes, said elements in each group comprising an isolation switch and a variable threshold voltage transistor having a floating electrode with means permitting charge tunneling between said floating electrode and one of said nodes.

2. The NOVRAM of claim 1, wherein said load comprises a load transistor of the opposite conductivity type including a load transistor control electrode.

3. The NOVRAM of claim 2 wherein said load transistor control electrode is connected directly to the latch transistor control electrode which is in the same set.

4. The NOVRAM of claim 1 wherein said load comprises a load transistor of said one conductivity type.

5. The NOVRAM of claim 1 wherein said tunneling means permits charge tunneling between said floating electrode and the opposite one of said nodes.

6. The NOVRAM of claim 1 wherein said isolation switch of each of said groups comprises a transistor having a control gate connected to the corresponding control gate of the other group.

7. The NOVRAM of claim 6, wherein said isolation switch of each of said groups comprises a source and a drain, and wherein said isolation switch shares in common with the isolation switch of the other group said control gate and one of said source and drain, the other of said source and drain being connected to the corresponding variable threshold transistor.

8. The NOVRAM of claim 1 wherein said floating gate is capacitively coupled to the latch transistor control electrode of the same set.

9. A nonvolatile random access memory (NOVRAM) including variable threshold voltage metal oxide semiconductor (VTVMOS) transistors, comprising:
    a first branch comprising a first p-channel transistor and a first n-channel transistor, each first transistor comprising a gate, a source and a drain and being connected together drain to drain at a first node therebetween;
    a second branch comprising a second p-channel transistor and a second n-channel transistor, each second transistor comprising a gate, a source and a drain and being connected together drain to drain at a second node therebetween, the sources of said first and second p-channel transistors being connected to a high supply line and the sources and said first and second n-channel transistors being connected to a low supply line;
    a first VTVMOS transistor associated with said first node, said first VTVMOS transistor including a first floating gate and including means for permitting electron tunneling between said first floating gate and said second node;

a second VTVMOS transistor associated with said second node, said second VTVMOS transistor including a second floating gate having means permitting electron tunneling between said second floating gate and said first node;

a first isolation transistor having a gate and being connected in series with said first VTVMOS transistor and one of said supply lines;

a second isolation transistor having a gate and being connected in series with said second VTVMOS transistor and said one supply line, the gates of said first and second isolation transistors being connected together; and means connecting between said second node and said first p-channel and n-channel transistor gates, and means connecting between said first node and said second p-channel and n-channel transistor gates.

10. The NOVRAM cell of claim 9 further comprising means for applying a restore signal to said first and second isolation transistor gates and bringing said high and low supply lines to the same voltage.

11. The NOVRAM cell of claim 9 further including an addressing transistor pair connected individually to said first and second nodes and to a bit line and a $\overline{bit}$ line respectively, said addressing transistor pair each having a gate connected together to a word line.

12. Th NOVRAM of claim 11 further comprising means for performing a restore operation by forcing said bit and $\overline{bit}$ lines to the same voltage, turning on said addressing transistor pair and bringing said low and high supply lines to the same voltage.

13. The NOVRAM of claim 9 further comprising means for bringing said high and low supply lines and said first and second nodes to the same voltage.

* * * * *